United States Patent [19]

Sagano

[11] Patent Number: 5,573,427
[45] Date of Patent: Nov. 12, 1996

[54] IC CARRIER

[75] Inventor: Hideki Sagano, Kawasaki, Japan

[73] Assignee: Yamaichi Electronics Co., Ltd., Tokyo, Japan

[21] Appl. No.: 183,937

[22] Filed: Jan. 21, 1994

[30]     Foreign Application Priority Data

Jan. 22, 1993 [JP] Japan ................................ 5-27592

[51] Int. Cl.⁶ ............................................. H05K 1/00
[52] U.S. Cl. ........................ 439/526; 439/330; 206/724
[58] Field of Search ............................ 439/68–70, 72,
439/264, 330, 331, 525, 526, 73; 206/722,
724, 728, 329

[56]             References Cited

U.S. PATENT DOCUMENTS 4,535,887  8/1985  Egawa ................................ 206/724
4,616,895 10/1986  Yoshizaki et al. .................. 439/330
4,881,639 11/1989  Matsuoka et al. .................. 206/724
4,887,969 12/1989  Abe ................................... 439/331
5,199,890  4/1993  Kubo ................................. 439/330
5,395,255  3/1995  Kato ................................. 439/330

FOREIGN PATENT DOCUMENTS 2101819  1/1983  United Kingdom ................ 439/330

*Primary Examiner*—Hien D. Vu
*Attorney, Agent, or Firm*—Wenderoth, Lind & Ponack

[57]                ABSTRACT

An IC socket includes a socket body, an IC receiving portion formed in the socket body, an engagement members for engaging an upper edge or upper surface of an IC package received in the IC receiving portion and applying a push-down force thereto, and a support members for elastically supporting the lower surface or lower edge of the IC package and applying a push-up force thereto. The IC package is held between the support members and the engagement members.

10 Claims, 3 Drawing Sheets

IC CARRIER

BACKGROUND OF THE INVENTION

1. Field of the Invention

This invention relates to an IC carrier designed for carrying an IC package thereon so as to be transported, stored, connected to an IC socket, or the like.

2. Brief Description of the Prior Art

A conventional IC carriers for an IC package having projected leads comprises an IC receiving portion, a lead support portion disposed at a peripheral surface of the IC receiving portion, and engagement means for engaging an upper edge or upper surface of the IC package whose leads are placed on the lead support portion, thereby retaining the IC package in the IC receiving portion.

However, the above-mentioned conventional IC carrier has shortcomings in that due to miniaturization of the leads as a result of high density integration of the IC package, the leads are liable to be deformed because a bend load is applied to the leads by a press-down force when the engagement means is brought into engagement with the upper edge or upper surface of the IC package, or because of vibrations and shocks to the IC package and the leads when the IC package is carried on the IC package.

SUMMARY OF THE INVENTION

It is therefore an object of the present invention to provide an IC socket in which the load incurred by leads can be reduced.

Another object of the present invention is to provide an IC socket in which vibrations and shocks incurred by an IC package and leads can positively be absorbed.

Another important object of the present invention is to provide an IC socket in which leads are fully protected from being accidentally deformed.

In order to achieve the above objects, according to one aspect of the present invention, there is essentially provided an IC socket comprising a socket body, an IC receiving portion formed in the socket body, engagement means for engaging an upper edge or upper surface of an IC package received in the IC receiving portion and applying a push-down force thereto, and support means for elastically supporting the lower surface or lower edge of the IC package and applying a push-up force thereto, the IC package being held between the support means and the engagement means.

From another aspect of the present invention, there is provided an IC socket comprising a socket body, an IC receiving portion formed in the socket body, engagement means for elastically engaging an upper edge or upper surface of an IC package received in the IC receiving portion and applying a push-down force thereto, and support means for elastically supporting the lower surface or lower edge of the IC package and applying a push-up force thereto, the IC package being held between the support means and the engagement means.

DETAILED DESCRIPTION OF THE EMBODIMENTS

An embodiment of the present invention will be described with reference to FIGS. 1 through 6 of the accompanying drawings.

Figure 1:
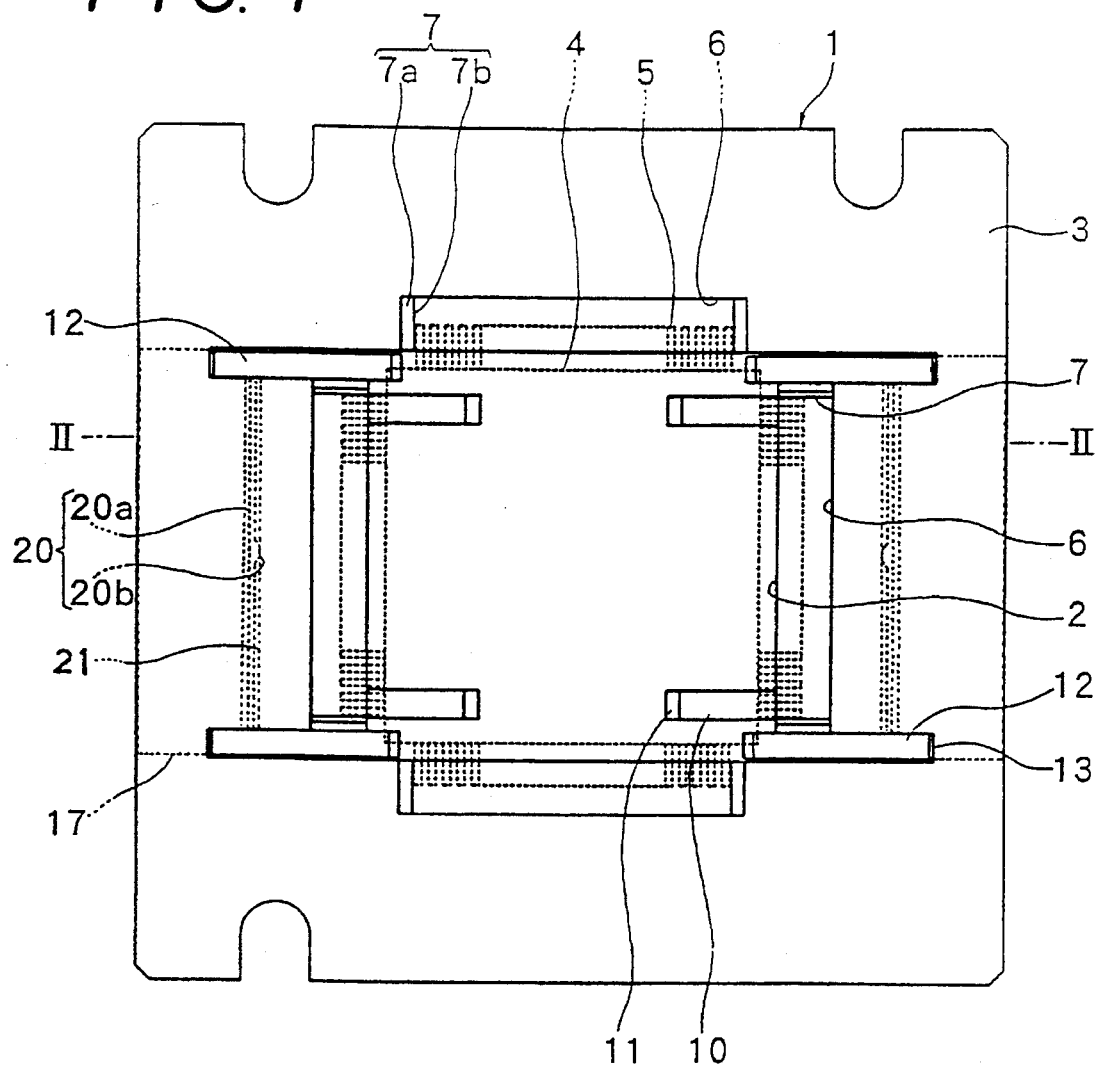
FIG. 1 is a plan view of an IC carrier according to one embodiment of the present invention, in which an engagement member is closed.
Figure 2:
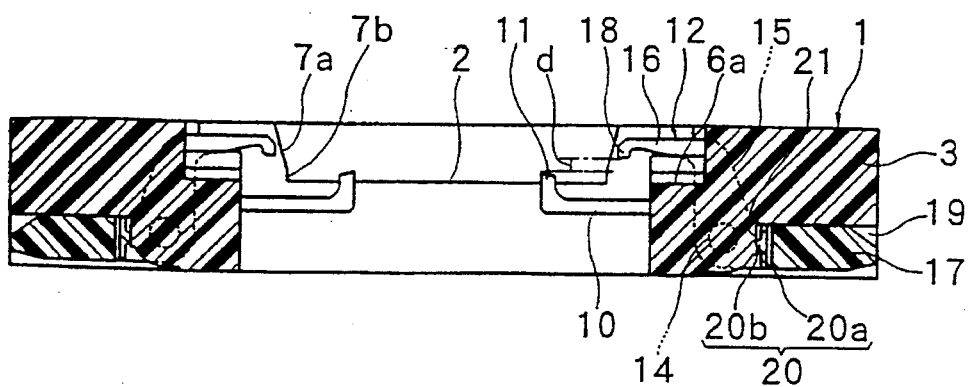
FIG. 2 is a cross-sectional view taken on line II—II of FIG. 1.

As shown in FIGS. 1 and 2, the IC carrier 1 is of a generally square outer configuration. The IC carrier 1 has a generally square IC receiving portion 2 formed in a central portion on its upper surface side and a frame member 3 defining the IC receiving portion 2. The frame member 3 is formed with lead support portions 6 each of which has a flat surface and is concave along each side of the IC receiving portion 2. A plurality of leads 5 projecting from each side of the IC package 4, as shown by dotted lines of FIG. 1, received in the IC receiving portion 2 are rested in and supported by the lead support portions 6, respectively.

A side wall 7 on each end side of an array of the leads 5 in each of the lead support portions 6 is formed with an upper inclination surface 7a for guiding the introduction of the lead 5 on each end side of the lead array at an initial stage of receiving the IC package 4 in the IC receiving portion 2, and a lower vertical surface 7b for restricting the lead 5 on each end side of the lead array at a final stage of receiving the IC package 4 into the IC receiving portion 2. Owing to this arrangement, the lead 5 on each end side of the lead array is restricted by the vertical surface 7b and therefore, the IC package 4 and the leads 5 grouped in each array are restricted in movement in not only a forward and backward direction but also a rightward and leftward direction. In the foregoing condition, the lower surfaces of the leads 5 are supported by the lead support portion 6, and the IC package and leads 5 are correctly positioned in the IC receiving portion 2.

A support member 10 adapted to elastically support a lower edge or lower surface of the IC package 4 and apply a push-up force thereto is provided on each end side of each array of leads 5 arranged on two opposite sides of the IC receiving portion 2. The support member 10 is constituted by a cantilevered arm projecting inwardly of the IC receiving portion 2 from each of the opposite inner wall surfaces of the IC receiving portion 2 on a level lower than a lead support surface 6a. A free end of the cantilevered arm is provided with a support projection 11 which projects upwardly exceeding the level of the lead support surface 6a.

Each corner portion of the IC receiving portion 2, in other words, each end side of the lead array in each lead support portion 6 is provided with an engagement member 12 adapted to engage an upper edge or upper surface of the IC package 4 and apply a push-down force thereto. The engagement member 12 is constituted by a latch lever 15 which can be moved between an engagement position shown in FIG. 2 and a release position shown in FIG. 3 so as to be opened and closed. The latch lever 15 is vertically turnably mounted on the frame member 3, through a support shaft 14, within an opening portion 13 which is formed at each corner portion of the IC receiving portion 2. The latch lever 15 has a pair of latch portions 16 extending from a supporting portion supported on the support shaft 4 toward the IC receiving portion 2 side at the upper surface of the IC carrier 1, and an operating portion 17 extending outwardly of a lower surface of the IC carrier 1 from the supporting portion and adapted to connect the pair of latch portions 16 together.

Figure 4:
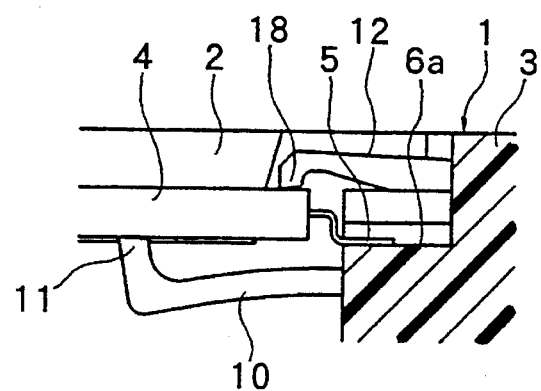
FIG. 4 is an enlarged cross-sectional view showing the engagement member and a support member of the IC carrier of FIG. 1, in which an IC package is held by the IC carrier.

Each of the latch portions 16 is provided at a foremost end portion thereof with an engagement projection 18 projecting downwardly and adapted to engage an upper edge or upper surface of each corner portion of the IC package 4. The engagement projection 18 and the support projection 11 of the support member 10 is smaller than the width of the body of the IC package 4. Owing to the foregoing arrangement, by bringing the engagement projection 18 into abutment with the upper edge or upper surface of the IC package 4 received in the IC receiving portion 2 and applying a push-down force thereto, the cantilevered arm constituting the support member 10 is displaced, as shown in FIG. 4, against the elasticity to apply a push-up force to the IC package 4. As a result, the IC package 4 is held between the support projection 11 of the support member 10 and the engagement projection 18 in a condition that an elastic force is stored therebetween. The respective support projections 11 are arranged inwardly of the engagement projections 18 such that the distances between the support projections 11 and the engagement projections 18 are equal to each other.

Figure 3:
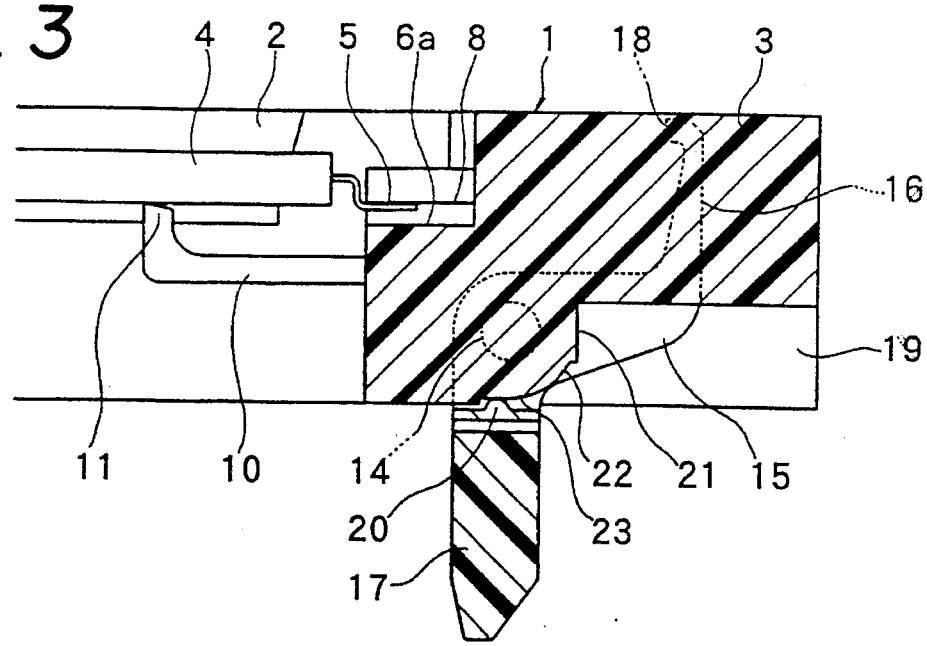
FIG. 3 is an enlarged cross-sectional view of the IC carrier of FIG. 1, but in which the engagement member is open.

The operating portion 17 is received in a recess portion 19 formed in a lower surface of the frame member 3 in the engagement position of the engagement member 12. The end portion of the operating portion 17 opposing the support shaft 14 is provided with a damping portion 20. The damping portion 20 includes an elastic element 20a connected to the lever 15 and a projection 20b projecting toward the support shaft 14 from the elastic element 20a. As shown in FIG. 2, when the engagement member 12 is in the engagement position relative to the IC package 4, the damping portion 20 is abutted against a vertical front wall surface 21 of the recess portion 19 with the elastic force stored, in order to retain the engagement position of the engagement member 12. As shown in FIG. 3, when the engagement member 12 is somewhere between the engagement position and the release position, the damping portion 20 is slid on an arcuate surface 22 about the support shaft 14 connected to a lower end of the front wall surface 21 and abutted against a horizontal lower wall surface 23 of a lower end of the arcuate surface 22 with the elastic force stored, so as to retain the release position of the engagement member 12.

Specifically, as shown in FIG. 3, when the engagement member 12, that is, the operating portion 17 of the latch lever 15 is pivoted downwardly from the recess portion 19, the latch portion 16 is pivoted upwardly about the support shaft 14 and the engagement projection 18 is retracted from the IC receiving portion 2. Furthermore, the damping portion 20 is elastically brought into contact with the lower wall surface 23 to stop the engagement member 12 (latch lever 15) in the release position. In the foregoing condition, the IC package 4 is received in the IC receiving portion 2. At the initial stage of the receiving operation, the upper inclination surface 7a of the side wall 7 positively guides the outer surface of the lead 5 on each end of the lead array of the IC package 4. On the other hand, at the final stage of the receiving operation, the vertical surface 7b restricts the outer surface of the lead 5 on each end of the lead array. In this way, a correct position, in the sense of rightward and leftward directions and forward and backward directions, of the IC package 4 relative to the IC receiving portion 2 is established. At the same time, the lower surface of the IC package 4 is supported by the support projections 11 of the support members 10, and the IC package 4 is received in the right position of the receiving portion 2 with the leads 5 spaced apart from the lead support surfaces 6a.

In the condition that the IC package 4 is received in the right position of the receiving portion 2, when the operating portion 17 of the engagement member 12 is turned upwardly, the latch portion 16 is pivoted downwardly about the support shaft 14 and the engagement projection 18 is brought into the IC receiving portion 2 from the retracted position, to engage the corner portion of the IC package 4 to apply a push-down force thereto. By this push-down force, as shown in FIG. 4, the support member 10 is displaced downwardly against the elasticity. Then, by a reacting force of the support member 10 caused by the downward displacement, a push-up force is applied to the IC package 4. As a result, a load, which is incurred by each lead 5 when the engagement member 12 engages the IC package 4, is reduced, thus positively preventing the leads 5 from being deformed. At this time, the projection 20b of the damping portion 20 is elastically brought into contact with the vertical surface 21 to retain the engagement member 12 in the engagement position. In that condition, the IC package 4 is positively elastically clamped by and retained between the engagement member 12 and the support member 10.

In the above retaining condition, vibrations and shocks transmitted from the IC carrier 1 to the IC package 4 and leads 5 are positively absorbed by the support member 10 and engagement member 12 which elastically retain the IC package 4. As a result, the leads 5 can be prevented from being deformed.

Figure 5:
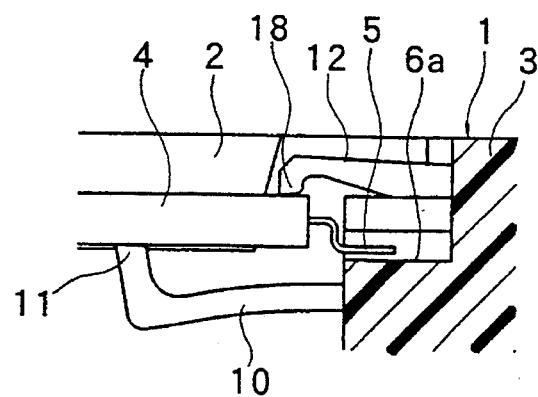
FIG. 5 is an enlarged cross-sectional view of the IC package held on the IC carrier of FIG. 1, in which the leads of the IC package are held in non-contacting relation to the carrier surface.

In the above retaining condition, since the push-down force of the engagement member 12 and the push-up force of the support member 10 are well balanced, the lead 5 is brought into abutment against the lead support portion 6 as shown in FIG. 4, or is retained such that a very small space is formed between the lead 5 and the lead support portion 6 as shown in FIG. 5.

In the case of FIG. 5, since the lead 5 of the IC package 4 is in a non-contacting relation to the carrier surface, the lead 5 does not receive any external force from the carrier body when the engagement member 12 engages the IC package 4 or when the IC package 4 is retained.

In the above retaining condition, when the operating portion 17 of the engagement member 12 is turned downwardly again, the latch portion 16 is pivoted upwardly, as in the above case, to release the engagement of the IC package 4 and attains a non-interference condition. In the foregoing condition, the IC package 4 is loaded and unloaded.

Figure 6:
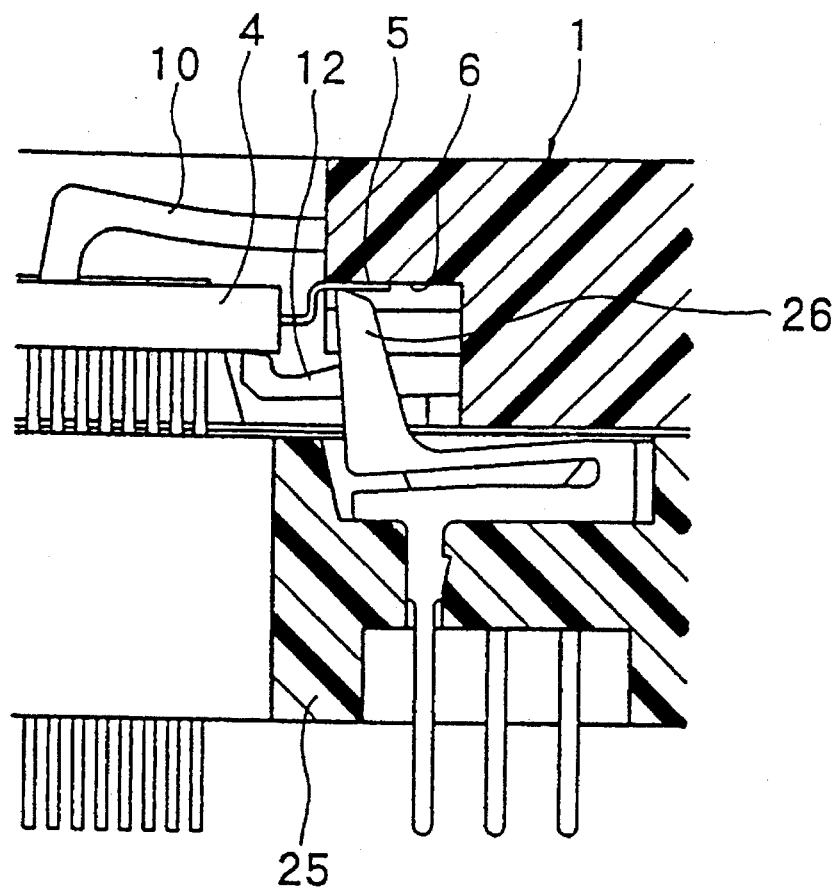
FIG. 6 is a cross-sectional view, partly enlarged, of the IC package held on the IC carrier of FIG. 1, in which the IC package is in contacting relation to the IC socket.

The IC carrier 1 carrying the IC package 4 is used as a protective means for transportation and storage, and in addition, as a contact means relative to an IC socket 25 as shown in FIG. 6. That is, as one form of use, the IC carrier 1 with the IC package 4 carried thereon is loaded in the IC socket 25, the leads 5 of the IC package 4 are brought into contact with contacts 26 retained by the IC socket 25, the leads 5 are pressure contacted with the contacts 26 by pushing down the IC carrier 1 with a presser cover, or the like, provided on the IC socket 25, and this pressure contacting condition is maintained by a lock lever disposed on the IC socket and being engaged with the presser cover.

In the above embodiment, the latch portion 16 has rigidity sufficient to not be elastically deformed by the push-up force of the support member 10.

In the above-mentioned embodiment, the latch portion 16 has elasticity, so that the latch portion 16 is elastically displaced by the push-up force of the support member 10.

The elasticity of the latch portion 16 is larger than that of the supporting member 10. In this case, the engagement member 12 is stopped in the release position, the IC package 4 is received in the IC receiving portion 2, and the lower surface of the IC package 4 is supported by the support member 10. In the foregoing condition, when the operating portion 17 of the engagement member 12 is turned upwardly, the latch portion 16 is turned downwardly about the support shaft 14 and the engagement projection 18 is caused to enter the IC receiving portion 2 from the retracted position to engage corner portions of the IC package 4. When the operating portion 17 is further turned upwardly, the latch portion 16 applies a push-down force to the IC package 4 while being displaced upwardly against the elasticity, and this push-down force causes the support member 10 to be elastically displaced downwardly to apply a push-up force to the IC package 4, so that the IC package 4 is clamped by the elasticity of the latch portion 16 and the elasticity of the support member 10. As a result, when the engagement member 12 is in engagement with the IC package 4, the load applied to each lead 5 can be reduced to positively prevent the lead 5 from being deformed. When the engagement member 12 is stopped in the engagement position for holding the IC package 4, the IC package 4 can be positively elastically held by and between the engagement member 12 and the support member 10. In addition, in the foregoing condition, since the vibrations and shocks liable to be transmitted from the IC carrier 1 to the IC package 4 and leads 5 are positively absorbed by the elasticity of the support member 10 and the elasticity of the engagement member 12 which elastically hold the IC package 4, the effect for preventing the deformation of the leads 5 is further improved.

As another example, the latch portion 16 has elasticity and the support member 10 has rigidity sufficient to not be elastically deformed by the push-down force of the latch portion 16. In this case, the engagement member 12 is stopped in the release position and the IC package 4 is received in the IC receiving portion 2 so that the lower surface of the IC package 4 is supported by the rigid support member 10. In the foregoing condition, when the operating portion 17 of the engagement portion 12 is turned upwardly, the latch portion 16 is turned downwardly about the support shaft 14 and the engagement projection 18 is caused to enter the IC receiving portion 2 from the retracted position to engage the corner portions of the IC package 4, and latch portion 16 applies a push down force thereto while being displaced upwardly against the elasticity. As a reaction to the push-down force of the latch portion 16, the rigid support member 10 applies a push-up force to the IC package 4. As a result, the load applied to each lead 5 can be reduced to positively prevent the leads 5 from being deformed. When the engagement member 12 is stopped in the engagement position for holding the IC package 4, the IC package 4 can be positively elastically held by and between the engagement member 12 and the support member 10. In addition, in the foregoing condition, since the vibrations and shocks liable to be transmitted from the IC carrier 1 to the IC package 4 and leads 5 are positively absorbed by the elasticity of the support member 10 and the elasticity of the engagement member 12 which elastically hold the IC package 4, the leads 5 can be positively prevented from being deformed.

In the above embodiment, although there has been described the IC carrier 1 which carries thereon the IC package 4 having leads projecting therefrom, the present invention can be likewise applied to an IC carrier which carries thereon a leadless IC package for preventing damage to an electrically-conductive foil.

As described in the foregoing, according to the present invention, owing to the arrangement in that the IC package received in the IC package is elastically held by and between the support means for applying a push-up force and the engagement means for applying a push-down force, the load applied to the leads is reduced and the vibrations and shocks applied to the leads are positively absorbed, thereby preventing the deformation of the leads.

Furthermore, according to the present invention, owing to the arrangement in that the leads of the IC package are held in a non-contacting condition relative to the carrier surface in a position where the push-up force of the support means and the push-down force of the engagement means are well balanced, the leads are completely free from loads, thus positively preventing the leads from being deformed.

What is claimed is:

1. An IC carrier for use in mounting an IC package having electrical leads in an IC socket having electrical contacts, said IC carrier being devoid of electrical contacts and comprising:

an IC receiving body having a substantially rectangular IC receiving portion formed therein;

a plurality of support members having upwardly facing support surfaces, said support members being mounted to said IC receiving body and positioned at respective corners of said substantially rectangular IC receiving portion to engage and apply a push-up force to a lower edge or lower surface of an IC package positioned in said IC receiving portion;

a plurality of engagement members having downwardly facing engagement surfaces, said engagement members being mounted to said IC receiving body and positioned at respective corners of said substantially rectangular IC receiving portion to engage and apply a push-down force to an upper edge or upper surface of the IC package positioned in said IC receiving portion;

wherein said support members are elastic members and elastically support the IC package when the IC package is positioned in said IC receiving portion.

2. An IC carrier as recited in claim 1, wherein said engagement members are elastic members and apply an elastic push-down force to the IC package when the IC package is positioned in said IC receiving portion.

3. An IC carrier as recited in claim 2, wherein said upwardly facing support surfaces of the support members positioned at respective corners of said IC receiving portion are horizontally offset in position from said downwardly facing engagement surfaces of the engagement members positioned at the same respective corners of said IC receiving portion, such that said support surfaces of said support members are located closer than said engagement surfaces of said engagement members to a center of said IC receiving portion.

4. An IC carrier as recited in claim 2, wherein the push-down force of said engagement members and the push-up force of said support members are balanced such that said engagement members and said support members together constitute a means for holding the IC package therebetween so that the IC package remains out of contact with said IC receiving body.

5. An IC carrier as recited in claim 2, wherein said support members comprise cantilever arms, and said support surfaces of said support members are located at free ends of said cantilever arms, respectively.

6. An IC carrier as recited in claim 2, wherein said engagement members comprise cantilever arms, and said engagement surfaces of said engagement members are located at free ends of said cantilever arms, respectively.

7. An IC carrier as recited in claim 1, wherein said upwardly facing support surfaces of the support members positioned at respective corners of said IC receiving portion are horizontally offset in position from said downwardly facing engagement surfaces of the engagement members positioned at the same respective corners of said IC receiving portion, such that said support surfaces of said support members are located closer than said engagement surfaces of said engagement members to a center of said IC receiving portion.

8. An IC carrier as recited in claim 1, wherein the push-down force of said engagement members and the push-up force of said support members are balanced such that said engagement members and said support members together constitute a means for holding the IC package therebetween so that the IC package remains out of contact with said IC receiving body.

9. An IC carrier as recited in claim 1, wherein said support members comprise cantilever arms, and said support surfaces of said support members are located at free ends of said cantilever arms, respectively.

10. An IC carrier as recited in claim 1, wherein said engagement members comprise cantilever arms, and said engagement surfaces of said engagement members are located at free ends of said cantilever arms, respectively.

\* \* \* \* \*